United States Patent
Burns

(10) Patent No.: US 6,206,267 B1
(45) Date of Patent: Mar. 27, 2001

(54) FULL COVERAGE THERMAL COUPLE

(75) Inventor: Doreen DePalma Burns, Chelmsford, MA (US)

(73) Assignee: 3COM Corporation, Santa Clara, CA (US)

( * ) Notice: Subject to any disclaimer, the term of this patent is extended or adjusted under 35 U.S.C. 154(b) by 0 days.

(21) Appl. No.: 09/475,897

(22) Filed: Dec. 30, 1999

(51) Int. Cl.$^7$ ............... B23K 31/12; B23K 31/00; G01K 31/10; G01K 1/14

(52) U.S. Cl. ............ 228/103; 228/104; 228/119; 374/137; 374/208

(58) Field of Search ................ 228/103, 104, 228/119, 178, 191, 227; 374/137, 187, 205, 208

(56) References Cited

U.S. PATENT DOCUMENTS

| | | | |
|---|---|---|---|
| 4,419,023 | * 12/1983 | Hager, Jr. ...................... | 374/179 |
| 4,605,833 | * 8/1986 | Lindberg ....................... | 219/56.22 |
| 4,787,551 | * 11/1988 | Hoyt et al. .................... | 228/179 |
| 5,234,151 | * 8/1993 | Spigarelli ...................... | 228/103 |
| 5,569,950 | * 10/1996 | Lewis et al. ................... | 257/467 |
| 5,666,272 | * 9/1997 | Moore et al. .................. | 361/735 |
| 5,735,450 | * 4/1998 | Heim et al. .................... | 228/191 |
| 5,831,333 | * 11/1998 | Malladi et al. ................. | 257/712 |
| 5,966,940 | * 10/1999 | Gower et al. ................... | 62/3.3 |
| 6,024,584 | * 2/2000 | Lemke et al. ................... | 439/83 |
| 6,043,990 | * 3/2000 | Johnson et al. ................. | 361/803 |
| 6,084,781 | * 7/2000 | Klein .............................. | 361/771 |

* cited by examiner

Primary Examiner—Clifford C. Shaw
Assistant Examiner—Colleen P. Cooke
(74) Attorney, Agent, or Firm—McGlew and Tuttle, P.C.

(57) ABSTRACT

A process for profiling solder joints of circuit boards including solder bumps is provided using an arrangement with a thin tape element with length and width dimensions generally corresponding to the length and width dimensions of the ball grid array (BGA) and with a registration portion. Thermal couple probes are positioned on the element at locations corresponding, based on the registration portion, to critical locations of the BGA requiring profiling. The element is disposed underneath the BGA and secured in position with the element in registration with the solder bumps on the BGA and with the plurality of thermal couples connected to the element such that the thermal couples are positioned corresponding to the critical locations requiring profiling. The tape element may be kapton tape. The registration may be provided with a portion of the element having holes, each hole being of a size to go over a solder bump on the BGA.

12 Claims, 4 Drawing Sheets

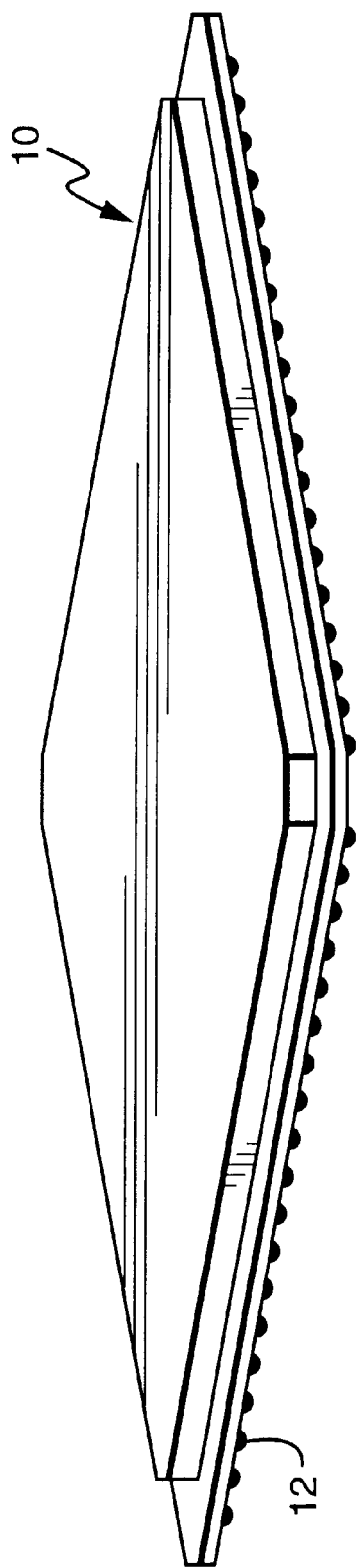
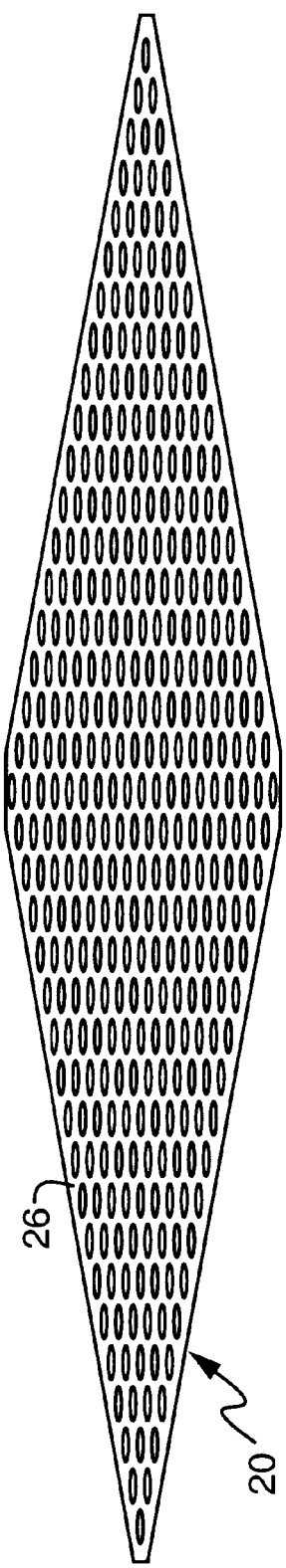
FIG. 1
FIG. 2

FULL COVERAGE THERMAL COUPLE

FIELD OF THE INVENTION

The invention relates generally to ball grid arrays (BGAs) provided on circuit boards and more particularly to profiling ball grid arrays, particularly as part of a rework process.

BACKGROUND OF THE INVENTION

The implementation of ball grid arrays has become more extensive. Ball grid arrays have been used to provide high input/output on printed circuit boards with less space while providing a rugged package that eliminates handling problems associated with fine-pitch devices.

PCB assembly processes, that employ ball grid arrays, typically start with a screen print operation with stencils to place solder paste on pads. The board typically passes to a pick and place machine which places components on paste at the bottom side of the board. After the board goes through a reflow oven, it then goes through a top side paste operation and then a top side pick and place operation. The board is placed in a reflow oven after each pick and place operation and subjected to a soak period in which the board is ramped up to a temperature (e.g. 126° C.). In a subsequent zone the temperature is brought up to the reflow temperature to form the solder joints. Next a cool down process is provided, particularly a slow cool down to provide good metallurgical properties to the board. There are many more operations which are typically provided, including testing. However, the operations noted are the basic operations of printed circuit assembly.

Problems can result with the final product including various different defects. The pins can be rotated, there can be poor joints and elements can be skewed. In such situations, a rework process may be followed to take the board off the ball grid array. Ball grid array that are removed from the board are typically not reused.

During rework, temperature profiling allows the ramp up of the ball grid array case and joints to temperatures of 100° C. via a thermal couple based event. After soaking at this level form one to three minutes, temperatures reach 120° to 135° C. at which the upper nozzle temperature and flow rate are set so the joints are a brought to 175° C. sea before reflow. This makes it easier to quickly ramp to the temperature without exceeding maximum allowable case temperatures or exceeding the 90 sec. limit above liquidus temperature. Profiling is also used to achieve the joint temperatures of 208° to 218° C., exceeding the case temperature, which is usually 230° C. to 235° C. Once the profile is optimized, several electrically rejected grid array should be installed and removed to verify the integrity of the process.

The publication "SUCCESSFUL GUIDELINES FOR BGA REWORK" describes rework operations and how they should replicate the original assembly process as closely as possible. A fully populated circuit board together with a minimum of five electrically rejected BGAs are provided for profiling. Since most ball grid arrays will be reworked on a populated board, a populated board is preferred over a bare board. Thermal couples (thermocouples) with wire diameter of 0.005 in. are placed into 0.018 in. drilled holes on the BGAs. The junction of the BGA is just above the pad surface, which is the joint created during the rework process. Junctions (Thermal couple probes) should be less than 0.006 in. above the board to insure the rise through the paste is prevented when micro-stenciling on to the site. The thermal couple is firmly attached to the board using tape. The thermal couple junction is often re-inspected to using magnification to position and center in the thermal couple on pad. If not centered, it may be necessary to remove the thermal couple and reapply the tape. This process can be quite tedious. However, it is absolutely essential to provide a good profile as part of a good rework process.

As the rework process represents additional thermal cycles a proper profile should be created ideally using the same profile board as used in the reflow oven. Sensing critical location temperatures should be provided to insure the vendors maximum allowable case temperatures are not exceeded during the rework process. However, the sensing involves the use of thermal couples strategically positioned wherein precise measurements are required. This can be problematic with regard to physical and system difficulties in obtaining a good profile.

SUMMARY AND OBJECTS OF THE INVENTION

It is an object of the invention to provide a ball grid array circuit board rework process which can used to replicate the original assembly process as closely as possible based on providing a good profile of temperature characteristics during rework in an efficient reproducible manner.

It is a further object of the invention to provide a profiling operation which allows extremely accurate positioning of thermal couples (thermal couple probe ends or junctions), allowing highly accurate and reproducible profiling of ball grid arrays.

It is a another object of the invention to provide a profiling assembly including a holding element with a registration feature which facilitates a quick and accurate positioning of the element relative to the ball grid array. The holding element holds thermal couple probes (i.e., thermocouple junction) connected to it in a selectable manner, relative to the registration feature. The registration feature allows a quick and accurate positioning of the element, and in turn a positioning of the thermal couple probes in a highly accurate way, in order to take measurements at critical locations relative to the ball grid array.

According to the invention, a process for profiling solder joints of BGAs on a circuit board is provided. The process includes forming or providing a sheet element, particularly a thin tape element with length and width dimensions generally corresponding to the length and width dimensions of the BGA and with a registration portion. Thermal couple probes are positioned on the element at locations corresponding, based on said registration portion, to critical locations of the BGA and board requiring profiling. The element is disposed on the BGA and it is secured it in position with the element in registration with the pads on the circuit board with the reflow machine and with the plurality of thermal couples connected to the element such that the thermal couples are positioned corresponding to the critical locations requiring profiling.

The thermal couples may then be connected to a reader machine. Readings may then be taken at the reader machine to produce the temperature profile.

The tape element may be KAPTON tape. The adhesive of the tape may be used to secure the element to the BGA. A reflow machine may also be used to attach the element. The registration, with respect to the circuit board pads, is preferably provided by forming a plurality of holes in the element. Each hole is of a size to go over a solder bump on the BGA.

The BGA solder joint profiling arrangement according to another aspect of the invention includes a thin sheet like element or tape element with length and width dimensions generally corresponding to the length and width dimensions of the BGA and with a registration portion for registering the position of the element with the solder pads on the circuit board. A plurality of thermal couple probes are attached to the element. The thermal couple probes (i.e., thermocouple junctions) are positioned at locations corresponding to critical locations of the circuit board requiring profiling based on the registration portion. The element is disposed on the BGA and secured in position based on the registration portion such that the thermal couples are positioned corresponding to the critical locations requiring profiling.

The registration portion is preferably a plurality of holes. Each hole is formed in the sheet element to be of a size to go over a solder bump on the BGA. Thermal couples are connected to the element such that the thermal couples are positioned corresponding to the critical locations requiring profiling.

A reader machine is provided for connection with the thermal couples. The thermal couple probes are connected to the reader machine. Readings corresponding to the critical locations are taken.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 1 is a perspective view of a BGA used in the process according to invention;

FIG. 2 is a perspective you showing a thin sheet element used in process according to the invention and provided as part of the arrangement according to the invention;

DESCRIPTION OF THE PREFERRED EMBODIMENT

Figure 3:
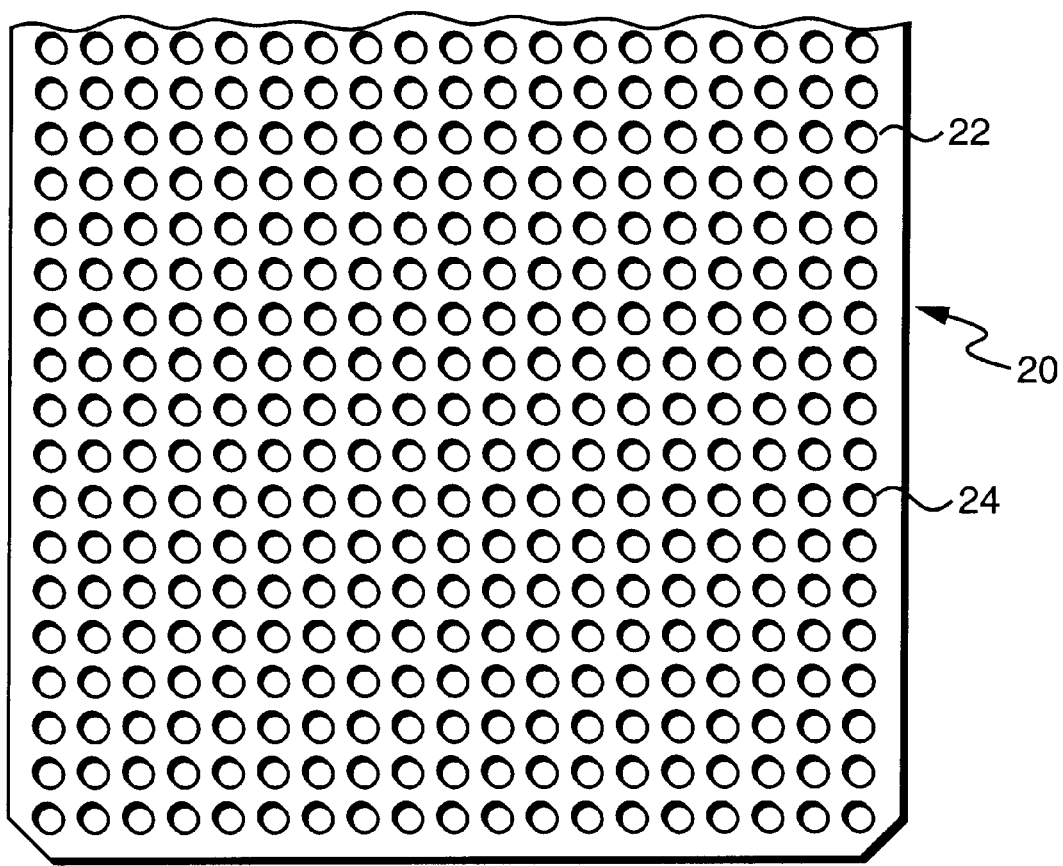
FIG. 3 is a top view of the element shown in FIG. 2.

Referring to the drawings in particular, the invention provides an arrangement which is used for profiling a BGA 10. The BGA 10, as shown in FIG. 1 has a plurality of solder bumps 12.

A sheet element generally designated 20 is prepared using a thin KAPTON tape piece. The thickness of the piece is about 0.005 mil. This thickness provides a good spacer (see FIG. 2).

As can be seen in FIG. 3, the element 20 has a registration portion 22. The registration portion 22 is formed of a plurality of openings 24. The openings 24 are provided by making a copy of the BGA, that is providing openings corresponding to the solder bumps. The holes or openings 24 are just large enough to go over a corresponding solder bump on the BGA 10 shown in FIG. 1.

The sheet element 20 has an adhesive surface 26 which may be used to attach the tape element 20 to the BGA 10. Additionally, the surface 26 is used to attach thermal couple junctions or probes 32 at critical locations on the tape element 20. These critical locations on the tape element 20 correspond to critical locations of the BGA 10. The registration portion 22 provides the relationship between position locations on the tape element 20 and the corresponding locations of the BGA.

Figure 4:
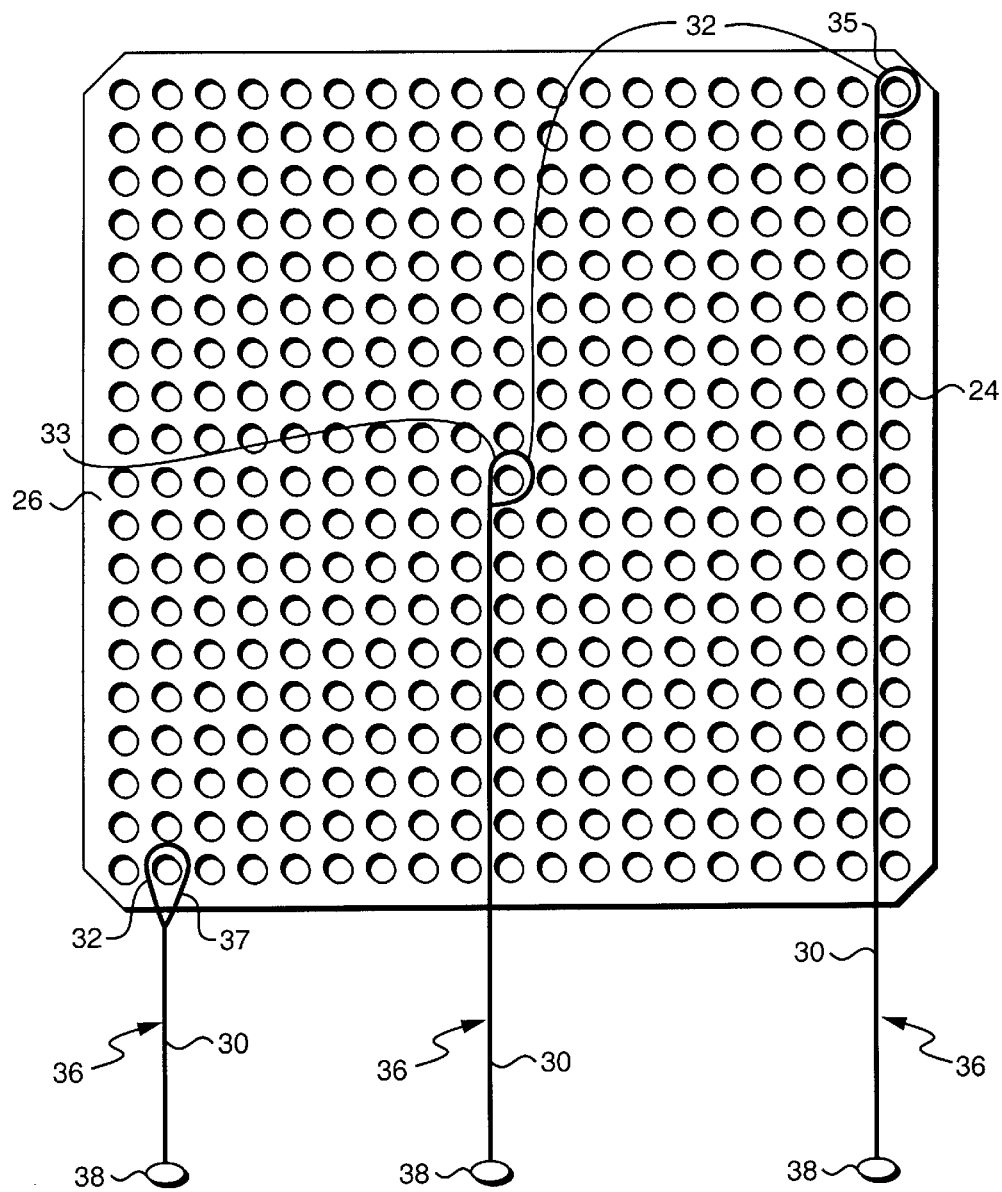
FIG. 4 is a top view showing the important parts of the profiling arrangement according to the invention.

Thermal couples 36 are provided. The thermal couples 36 include a junction or probe 32 and connection wires 30 as well as disconnects 38. The disconnects 38 allow for connection to the reader. The junctions or probes 32 are disposed on the element 20 and the thermal couples 36 are connected to the element 20. The process includes providing the arrangement as discussed above. A reader machine is also provided. The sheet element 20 is provided with the registration portion 22 having opening at predefined locations. The locations generally corresponding to the solder bumps. However, fewer or more openings may be used or other registration techniques may be used. Thermal couples are provided as part of the arrangement used in the process. The probes or junctions 32 are then disposed on the element 20 at the critical locations based on the registration feature. The wire 30 is arranged as shown in FIG. 4. The assembly is then applied to the BGA 10 with the bumps 12 within a corresponding opening 24.

Figure 5:
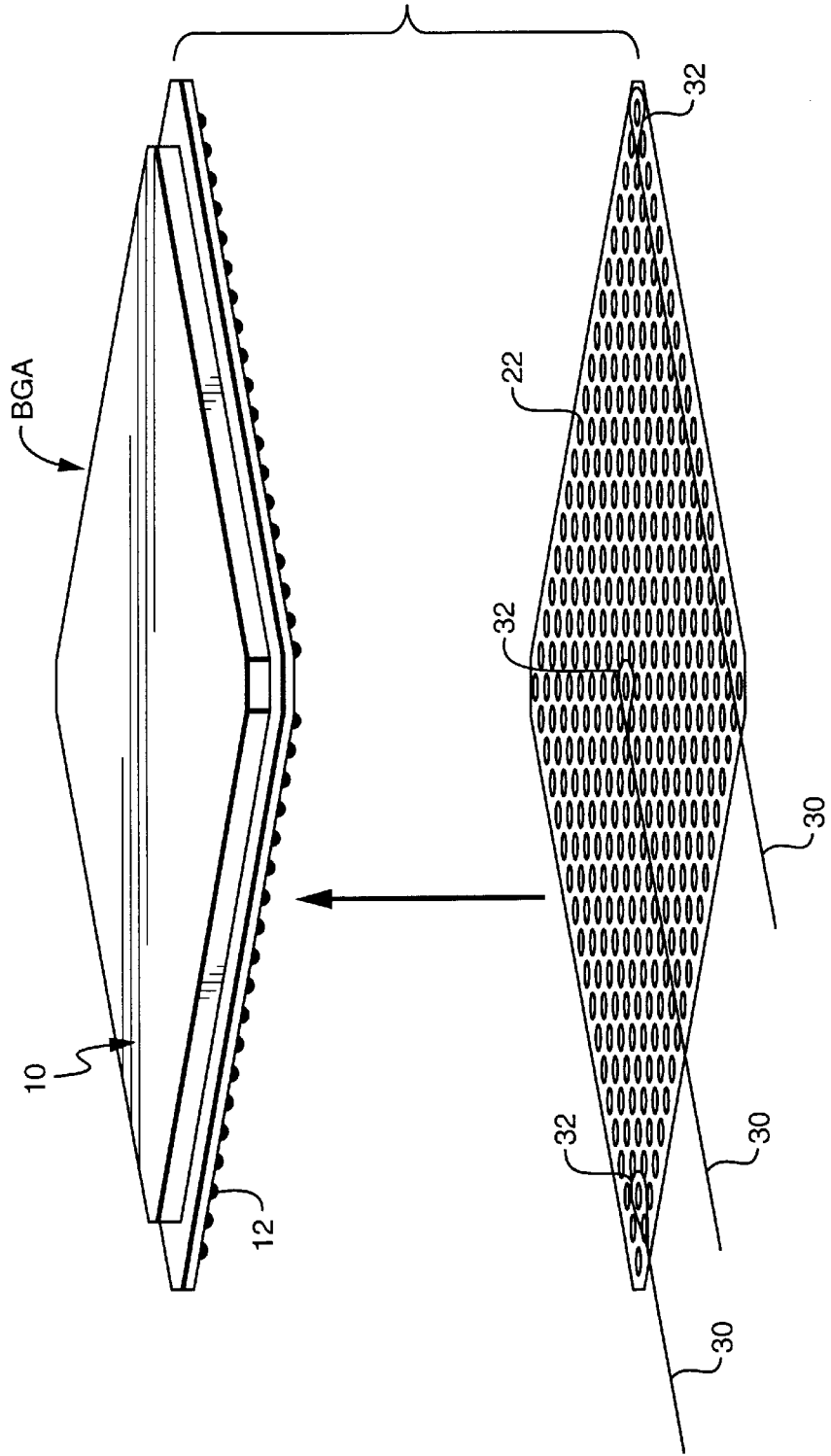
FIG. 5 is a perspective view showing the BGA positioned relative to the profiling arrangement of FIG. 4.

The thermocouple wires 30 are disposed with the junctions 32 located at the critical locations according to the preferred process, as shown FIG. 4. As can be seen, junction 33 is positioned for measuring a center critical temperature. The junctions 35 and 37 are positioned for measuring edge temperatures. Additional or fewer junctions or probes 32 may also be provided. With the thermal couple elements 36 positioned with probes 32 in locations as shown, attached to the tape element 20, the tape element is positioned as shown in FIG. 5. With the tape element 20 and the thermocouples 36 built into the tape element 20, the tape element 20 is placed onto the BGA to be profiled with a registration of position of the tape and positions on the BGA. The tape element 20 is then secured in place.

The BGA with a element 20 is placed onto the board or attached using a reflow machine. Subsequently the thermal couple wires 30 are attached to a reader machine (i.e. Thermal Mole). Preferably the three readings for profiling are taken at once.

The arrangement and process described avoid the risk that the wire 30 will be moved, or yanked or that the thermal couple junction 32 will be displaced or improperly positioned. The arrangement secures the probe or junction 32 in position thereby providing dependable, reliable and reproducible profiling. This ensures the highest reliability in temperature readings.

The arrangement makes profiling BGAs faster and more efficient. The data readings will be more valuable to confirm improper profile of the BGA.

While specific embodiments of the invention have been shown and described in detail to illustrate the application of the principles of the invention, it will be understood that the invention may be embodied otherwise without departing from such principles.

What is claimed is:

1. A process for profiling solder joints of a ball grid array (BGA) on a circuit board, the process comprising the step of:

providing a thin element with length and width dimensions generally corresponding to the length and width dimensions of the BGA and with a registration portion for registration of the thin element with solder bumps on the BGA and providing an indication of locations on the thin element corresponding to locations on the BGA;

position thermal couples on the thin element at locations corresponding to critical locations of the BGA requiring profiling, the locations on the thin element being determined based on the identification of locations corresponding to location on the BGA;

disposing the element on the circuit board and securing it in position, with the element in registration with solder bumps on the BGA with circuit board pads and with the plurality of thermal couples connected to the thin element such that the thermal couples are positioned corresponding to the critical locations requiring profiling.

2. The process according to claim 1, further comprising the steps of:

connecting the thermal couples to a reader machine; and taking readings at the reader machine.

3. The process according to claim 1, wherein the thin element is a tape element.

4. The process according to claim 3, wherein the tape element is polyimide film tape.

5. The process according to claim 1, wherein the registration is provided with plurality of holes, each hole being of a size to go over a solder bump.

6. A circuit board ball grid array (BGA) solder joint profiling arrangement comprising:

a thin element with length and width dimensions generally corresponding to the length and width dimensions of the BGA and with a registration portion for registering the position of the thin element with the solder pads on the circuit board and for providing an indication of locations on the thin element corresponding to locations on the BGA;

thermal couple probes attached to the element, the thermal couples being positioned at locations of said thin element corresponding to critical locations of the circuit board requiring profiling based on the indication of locations provided by said registration portion, the element being disposed on the BGA and secured in position based on the registration portion such that the thermal couples are positioned corresponding to the critical locations requiring profiling.

7. The profiling arrangement according to claim 6, wherein said registration portion is a plurality of holes, each hole being of a size to go over a solder bump on the circuit board and with the plurality of thermal couples connected to the element such that the thermal couples are positioned corresponding to the critical locations requiring profiling.

8. The profiling arrangement according to claim 7, further comprising:

a reader machine, said thermal couples probes being connected to said reader machine whereby readings corresponding to said critical locations are taken.

9. The process according to claim 6, wherein the thin element is a tape element.

10. The process according to claim 9, wherein the tape element is polyimide film tape.

11. A ball array (BGA)/circuit board solder joint profiling arranging comprising:

a tape element with length and width dimensions generally corresponding to the length and width dimensions of the BGA and with a plurality of holes, each hole being of a size to go over a solder bump on the circuit board;

a plurality of thermal couple probes attached to the element, the thermal couples probes being positioned of locations corresponding to critical location of the circuit board requiring profiling, the element being disposed on the BGA and secured in position relative to the holes with each hole receiving a solder bump such that the thermal couples probes are positioned relative to the BGA corresponding to the critical location requiring profiling.

12. The arrangement according to claim 11, wherein the tape element is polyimide film tape.

* * * * *